US010879100B2

(12) United States Patent
Hayashi et al.

(10) Patent No.: US 10,879,100 B2
(45) Date of Patent: Dec. 29, 2020

(54) SUBSTRATE TRANSFER DEVICE, SUBSTRATE TRANSFER METHOD AND RECORDING MEDIUM

(71) Applicant: Tokyo Electron Limited, Tokyo (JP)

(72) Inventors: Tokutarou Hayashi, Koshi (JP); Hiroki Harada, Koshi (JP); Akihiro Teramoto, Koshi (JP); Tooru Tokimatu, Koshi (JP); Masahiro Abe, Koshi (JP); Kazutoshi Ishimaru, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 252 days.

(21) Appl. No.: 15/901,954

(22) Filed: Feb. 22, 2018

(65) Prior Publication Data
US 2018/0240695 A1 Aug. 23, 2018

(30) Foreign Application Priority Data

Feb. 23, 2017 (JP) ................................ 2017-031948

(51) Int. Cl.
G06F 7/00 (2006.01)
H01L 21/677 (2006.01)
G03F 7/16 (2006.01)
H01L 21/67 (2006.01)
B65G 43/08 (2006.01)
(Continued)

(52) U.S. Cl.
CPC ........ H01L 21/67706 (2013.01); B65G 43/08 (2013.01); G03F 7/162 (2013.01); G03F 7/70733 (2013.01); H01L 21/67051 (2013.01); H01L 21/67259 (2013.01);
(Continued)

(58) Field of Classification Search
None
See application file for complete search history.

(56) References Cited

U.S. PATENT DOCUMENTS

2004/0151574 A1* 8/2004 Lu .................... H01L 21/681
414/816
2004/0158347 A1* 8/2004 Sha ................ H01L 21/67259
700/218

(Continued)

FOREIGN PATENT DOCUMENTS

JP 2012-064918 A 3/2012
JP 2012064918 A * 3/2012 ............ H01L 21/68

Primary Examiner — Yolanda R Cumbess
(74) Attorney, Agent, or Firm — Pearne & Gordon LLP

(57) ABSTRACT

A device includes a substrate holding unit 25 configured to hold a substrate and be movable in a transversal direction to transfer the substrate from one module to another module; a first detecting unit 3 configured to detect a position of the substrate on the substrate holding unit 25 before the substrate holding unit 25 transfers the substrate into the another module after receiving the substrate from the one module; second detecting units 55 and 56 configured to detect a position deviation between a position of the substrate holding unit 25, which is located at a temporary position set to transfer the substrate into the another module, and the temporary position; and a position determining unit 10 configured to determine a transfer position where the substrate is transferred into the another module based on the position of the substrate on the substrate holding unit 25 and the position deviation.

10 Claims, 12 Drawing Sheets

(51) Int. Cl.
*H01L 21/687* (2006.01)
*G03F 7/20* (2006.01)
*H01L 21/68* (2006.01)

(52) U.S. Cl.
CPC ...... *H01L 21/67742* (2013.01); *H01L 21/681* (2013.01); *H01L 21/68707* (2013.01)

(56) References Cited

U.S. PATENT DOCUMENTS

2014/0374375 A1* 12/2014 Zwiers .................. H05K 1/092
 216/13
2015/0136331 A1* 5/2015 Tamura ................ B32B 43/006
 156/750

* cited by examiner

SUBSTRATE TRANSFER DEVICE, SUBSTRATE TRANSFER METHOD AND RECORDING MEDIUM

CROSS-REFERENCE TO RELATED APPLICATION

This application claims the benefit of Japanese Patent Application No. 2017-031948 filed on Feb. 23, 2017, the entire disclosures of which are incorporated herein by reference.

TECHNICAL FIELD

The embodiments described herein pertain generally to a substrate transfer device configured to transfer a substrate while holding the substrate by a substrate holding unit, a substrate transfer method, and a recording medium having stored thereon a computer-executable program for implementing the substrate transfer method.

BACKGROUND

In a photolithography process as one of semiconductor manufacturing processes, processes may be performed on a semiconductor wafer (hereinafter, simply referred to as "wafer") as a substrate by using a coating and developing apparatus which is configured to perform: formation of a coating film with a chemical liquid such as resist; development after exposure to light by an exposure apparatus; and heating processing after the coating of the chemical liquid or after the exposure and before the development. The coating and developing apparatus is equipped with multiple numbers of modules configured to perform the aforementioned various processings and a transfer mechanism configured to transfer the wafer between the modules. The transfer mechanism is equipped with a member configured to be moved along a horizontal axis and a vertical axis; a member configured to be pivoted around a rotation axis; and a substrate holder configured to hold the wafer. The substrate holder is moved between the modules by the cooperation of the individual members of the transfer mechanism, so that the transfer of the wafer is carried out.

In a resist film forming module among the multiple numbers of modules, after a resist film is formed on the entire surface of the wafer, a solvent of the resist is supplied onto a peripheral portion of the wafer being rotated on a spin chuck, and an unnecessary resist film on the peripheral portion of the wafer is removed in a ring shape. In order to increase a yield of chips as semiconductor products produced from the wafer by suppressing a width of this ring-shaped region from which the resist is removed, the wafer needs to be transferred into the resist film forming module such that a center of rotation of the spin chuck and a center of the wafer are aligned with high accuracy. Further, in order to perform highly accurate processings in the other modules as well as the resist film forming module, the wafer needs to be transferred to a preset position of each processing module with high accuracy.

In order to meet these requirements, it may be considered to improve position reproducibility of setting a position of the substrate holder to a preset position whenever the wafer is transferred into the modules. However, the aforementioned individual members of the transfer mechanism may be slightly deviated from preset positions as they are operated at a high speed, and repetition of the position deviation of the individual members of the transfer mechanism may result in a position deviation of the substrate holder. Thus, it is difficult to improve the position reproducibility over a certain level. Furthermore, due to heat from the heating module, there may occur problems such as an extension of frames forming the individual processing modules or an extension of a timing belt forming a driving mechanism configured to move each part of the transfer mechanism, and so forth. If these problems take place, the required position reproducibility may not be achieved.

Patent Document 1 describes a technique of transferring a wafer based on a detection result of a detector configured to detect a position of the wafer held by a substrate holder in order to transfer the wafer to the preset position of a module with high accuracy. In view of the aforementioned requirements, however, there is still a demand for a technique capable of transferring the wafer with higher accuracy.

Patent Document 1: Japanese Patent Laid-open Publication No. 2012-064918

SUMMARY

In view of the foregoing, exemplary embodiments provide a technique capable of transferring a substrate to a preset position of a module with high accuracy.

In one exemplary embodiment, a substrate transfer device includes a substrate holding unit configured to hold a substrate and allowed to be moved in a transversal direction to transfer the substrate from one module to another module; a first detecting unit configured to detect a position of the substrate on the substrate holding unit before the substrate holding unit transfers the substrate into the another module after receiving the substrate from the one module; a second detecting unit configured to detect a position deviation between a position of the substrate holding unit, which is moved to be located at a temporary position set to transfer the substrate into the another module, and the temporary position; and a position determining unit configured to determine a transfer position where the substrate is transferred into the another module based on the position of the substrate on the substrate holding unit and the position deviation.

In another exemplary embodiment, a substrate transfer method includes moving a substrate holding unit holding a substrate in a transversal direction to transfer the substrate from one module to another module; detecting, by a first detecting unit, a position of the substrate on the substrate holding unit before the substrate holding unit transfers the substrate into the another module after receiving the substrate from the one module; detecting, by a second detecting unit, a position deviation between a position of the substrate holding unit, which is moved to be located at a temporary position set to transfer the substrate into the another module, and the temporary position; and determining, by a position determining unit, a transfer position where the substrate is transferred into the another module based on the position of the substrate on the substrate holding unit and the position deviation.

In still another exemplary embodiment, there is provided a computer-readable recording medium having stored thereon computer-executable instructions that, in response to execution, cause a substrate transfer method to be performed in a substrate transfer device configured to hold a substrate by a substrate holding unit and transfer the substrate.

According to the exemplary embodiments, there is provided the first detecting unit configured to detect the position of the substrate received by the substrate holding unit.

Further, there is provided the second detecting unit configured to detect the position deviation between the position of the substrate holding unit, which is moved to be located at the temporary position set to transfer the substrate into the module, and the temporary position. Based on the detected position of the substrate and the position deviation, the transfer position where the substrate is transferred into the module is determined. Therefore, the substrate can be transferred to the preset position of the module with high accuracy.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
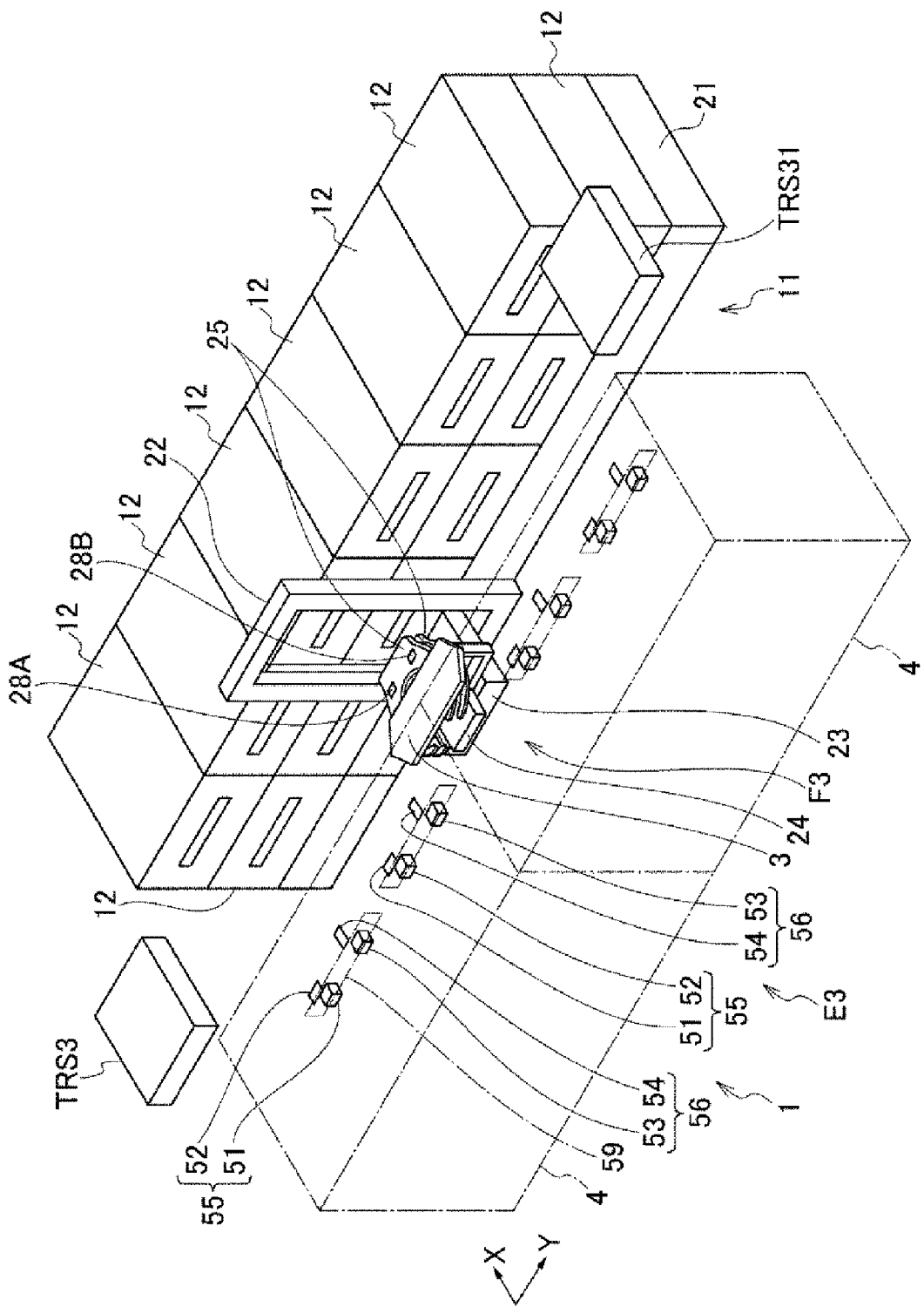
FIG. 1 is a perspective view of a unit block of a coating and developing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide a clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A unit block E3 having therein a substrate transfer device as a transfer mechanism according to an exemplary embodiment and constituting a coating and developing apparatus 1 as a substrate processing apparatus will be explained with reference to a perspective view of FIG. 1. The unit block E3 is equipped with a transfer section 11 for a wafer W as a substrate having a circular shape, and this transfer section 11 is extended transversally in a straight line shape. Provided at one end side of the transfer section 11 in a lengthwise direction thereof is a transit module TRS3 in which the wafer W is placed to be transferred into the unit block E3. The lengthwise direction of the transfer section 11 is defined as a front-rear direction, and the one end side where the transit module TRS3 is provided is defined as a front side. For the convenience of explanation, a horizontal direction in the front-rear direction may be sometimes referred to as "Y direction". Further, in the following description, a right side and a left side are defined with respect to a direction in which a rear side is viewed from the front side, and a horizontal direction in the left-right direction may sometimes be referred to as "X direction" for the convenience of explanation. The X direction and the Y direction are orthogonal to each other.

Multiple heating modules 12 are arranged at the left side of the transfer section 11 along the front-rear direction, and the heating modules 12 are stacked in two levels. Each heating module 12 is equipped with a heat plate and is configured to heat the wafer W placed on the heat plate. Two resist film forming modules 4 are arranged at the right side of the transfer section 11 along the front-rear direction. The rear side of the transfer section 11 is connected to an interface block D3 which is partitioned from the unit block E3. The interface block D3 is equipped with a transit module TRS31 in which the wafer W is placed to be carried out of the unit block E3.

Figure 2:
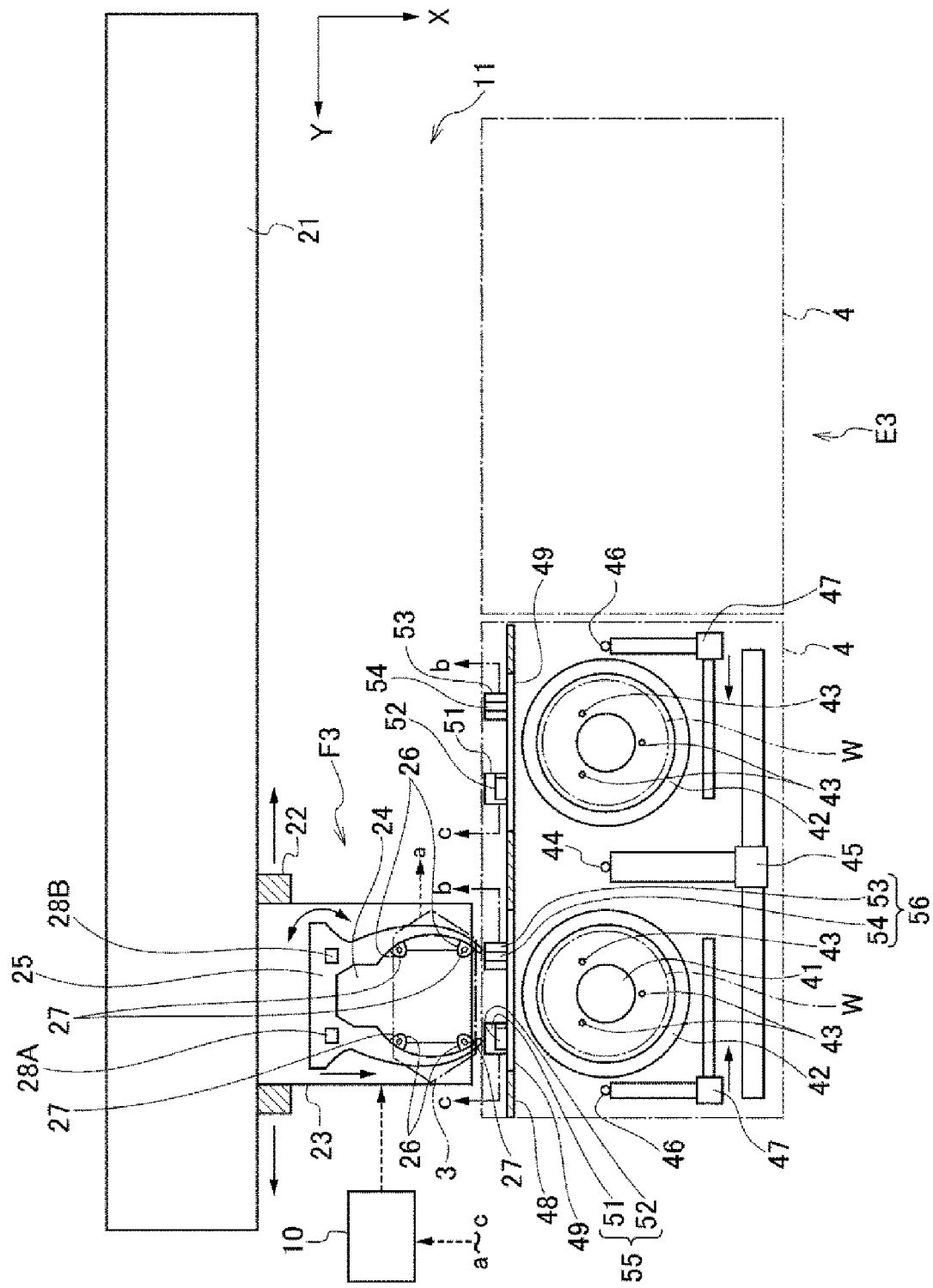
FIG. 2 is a plan view of a transfer mechanism provided in the unit block.

The unit block E3 is equipped with a transfer mechanism F3 for the wafer W. The wafer W transferred into the transit module TRS3 is carried into the resist film forming module 4 by the transfer mechanism F3. Then, after being liquid-processed therein, the wafer W is transferred into and heated by the heating module 12. Then, the wafer W is transferred into the transit module TRS31. FIG. 2 is a plan view of the unit block E3, and the transfer mechanism F3 will be discussed in further detail with reference to FIG. 2.

The transfer mechanism F3 includes a front-rear driving unit 21, a frame 22, an elevation unit 23, a base 24, two forks 25 and a wafer detecting unit 3. The front-rear driving unit 21 is provided under the heating module 12, and configured to move the frame 22 horizontally in the front-rear direction. The frame 22 stands uprightly to surround the elevation unit 23, and is configured to move the elevation unit 23 in the vertical direction. The base 24 is provided on the elevation unit 23, and configured to be rotated around a vertical axis by the elevation unit 23. The two forks 25 are provided on the base 24 while being overlapped with each other in the vertical direction, and the base 24 moves these forks 25 forwards and backwards individually between a retreat position and an advance position on the base 24. As stated above, to move the individual components, each of the front-rear driving unit 21, the frame 22, the elevation unit 23 and the base 24 is equipped with a driving mechanism including a motor, a timing belt and a pulley. The motor has an encoder so that a control unit 10 to be described later can detect positions of the individual components.

Figure 3:
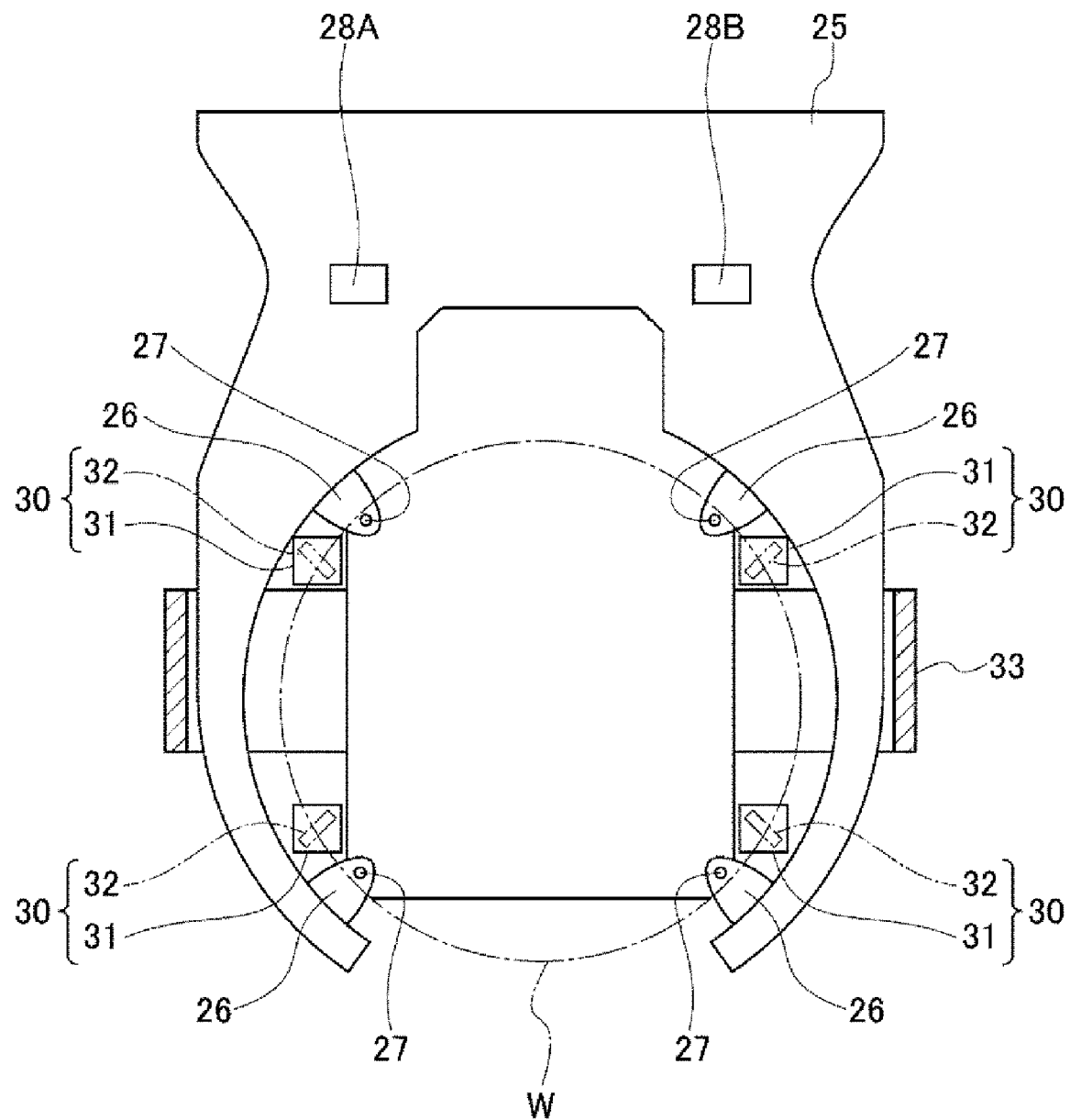
FIG. 3 is a plan view of a holding unit constituting the transfer mechanism.

FIG. 3 is a plan view of the fork 25 forming a substrate holding unit. One of the two forks 25 is used to receive the wafer W from the module, and the other is used to deliver the wafer W to the module. Each fork 25 is equipped with a flat main body in which a leading end portion is bifurcated from a base portion to be extended toward a forward moving direction of the fork 25 and is formed in an approximately horseshoe shape to surround a circumferential edge of the wafer W. Four claws 26 configured to support a rear surface of the wafer W are protruded from the main body, and each claw 26 is provided with a suction hole 27 for suctioning and holding the rear surface of the wafer W while the wafer W is held. When the base 24 is lowered to deliver the wafer W to the module, this suctioning is stopped. Further, two through holes are provided at a base end side of the fork 25 with a distance maintained therebetween in a direction orthogonal to the forward/backward moving direction. The through hole at the front side and the through hole at the rear side are respectively assigned reference numerals 28A and 28B.

The wafer detecting unit 3 will be explained with reference to a perspective view of FIG. 4. The wafer detecting unit 3 includes four light projecting parts 31 provided under each fork 25; four light receiving parts 32 provided above each fork 25; and a supporting part 33 for supporting the light projecting parts 31 and the light receiving parts 32 with respect to the base 24. One light projecting part 31 and one light receiving part 32 form a set and are configured as a single transmission type photoelectric sensor. Each set of the light projecting part 31 and the light receiving part 32 is configured as a wafer detecting sensor 30, and the wafer detecting sensors 30 constitute a first detecting unit. The light projecting part 31 and the light receiving part 32 belonging to the same set are arranged in the vertical direction such that a peripheral portion of the wafer W which is held by the fork 25 located at the retreat position is located therebetween. The individual sets are arranged at a regular distance therebetween in the circumferential direction of the wafer W.

Figure 4:
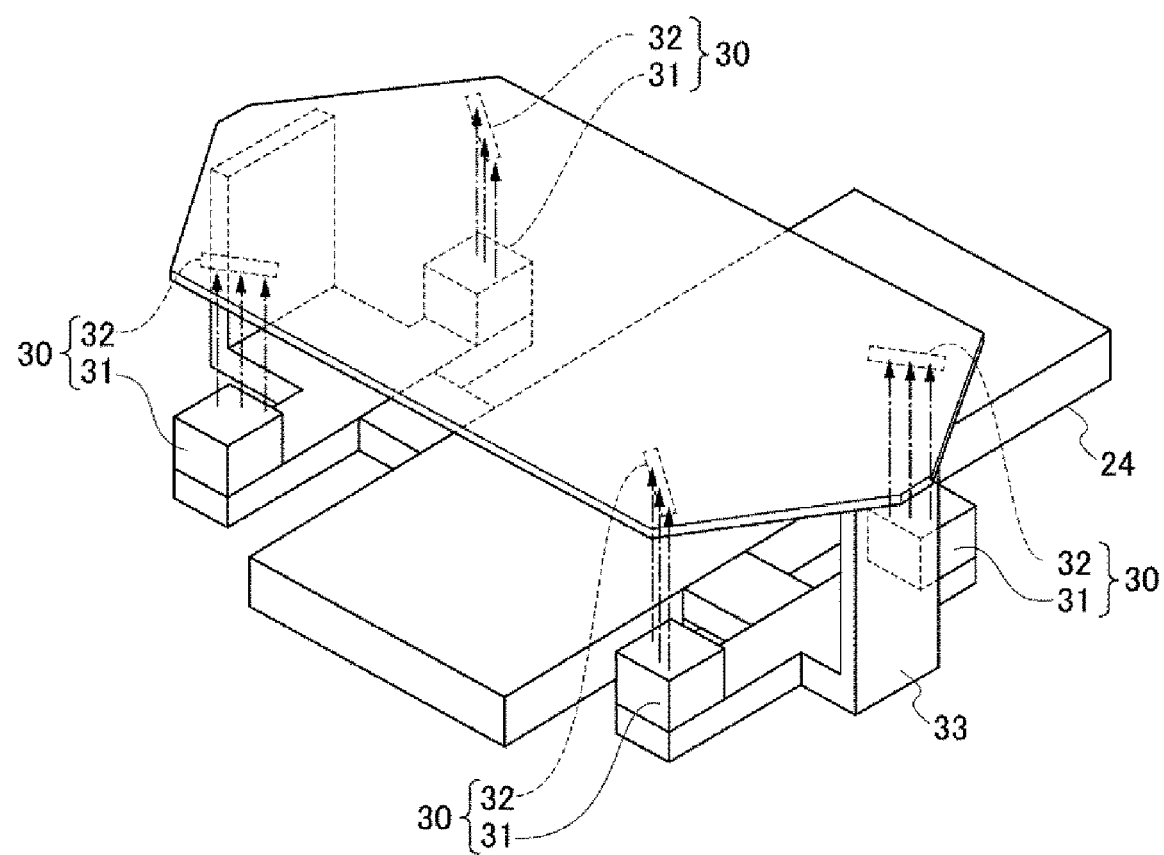
FIG. 4 is a perspective view of a wafer detecting unit constituting the transfer mechanism.

The light projecting part 31 is configured to irradiate light upwards, and arrows in the drawing FIG. 4 indicate corresponding optical paths. The light receiving part 32 is composed of multiple light receiving elements arranged in a straight line shape from a central side of the wafer W toward an edge side thereof. A part of the light irradiated from the light projecting part 31 is blocked by the peripheral portion of the wafer W held by the fork 25 located at the retreat position, and the other part of the light is received by the light receiving part 32 through outside of the wafer W. Accordingly, a size of a light irradiation region of the light receiving part 32 to which the light is irradiated, or, the number of the light receiving elements which receive the light is varied depending on a circumferential edge position of the wafer W located directly above the light projecting part 31. The light receiving part 32 sends a detection signal corresponding to the size of the light irradiation region to the control unit 10 to be described later. The control unit 10 detects the circumferential edge positions of the wafer W directly above the individual light receiving parts 32 based on the detection signals and calculates a position of a center of the wafer W held by the fork 25 from these detected positions.

Referring back to FIG. 2, the resist film forming module 4 will be discussed. In the drawing, a reference numeral 41 denotes a spin chuck which is configured to hold the wafer W horizontally by attracting the central portion of the rear surface of the wafer W and configured to be rotated by a non-illustrated rotating device to rotate the held wafer W around the vertical axis. Two spin chucks 41 are provided along the left-right direction. In the drawing, a reference numeral 42 denotes a cup, and two cups 42 are provided, and each cup 42 surrounds a space under the wafer W and a side of the wafer W held by the corresponding spin chuck 41 and suppresses scattering of a chemical liquid. In the drawing, a reference numeral 43 denotes an elevating pin, and three elevating pins 43 configured to be moved up and down are provided within each cup 42. Three elevating pins 43 serve to deliver the wafer W between the spin chuck 41 and the fork 25 located above the corresponding cup 42.

In the drawing, a reference numeral 44 denotes a resist discharge nozzle configured to discharge a resist vertically downwards. The resist discharge nozzle 44 is moved by a moving mechanism 45 between a position above the center of the wafer W held by the spin chuck 41 and outside of the corresponding cup 42 when viewed from the top. This resist discharge nozzle 44 is shared by the two cups 42. In the drawing, a reference numeral 46 denotes a thinner discharge nozzle configured to discharge a thinner as a solvent of the resist vertically downwards. The thinner discharge nozzle 46 is moved by a moving mechanism 47 between a position above a peripheral portion of the wafer W held by the spin chuck 41 and outside of the corresponding cup 42 when viewed from the top. In this resist film forming module 4, the resist is discharged from the resist discharge nozzle 44 onto the central portion of the wafer W being rotated by the spin chuck 41, so that a resist film is formed on the entire surface of the wafer W by spin coating. Then, the thinner is discharged onto the peripheral portion of the wafer W being rotated from the thinner discharge nozzle 46 which is configured as a processing liquid supply nozzle, so that an unnecessary resist film is removed in a ring shape.

Figure 5:
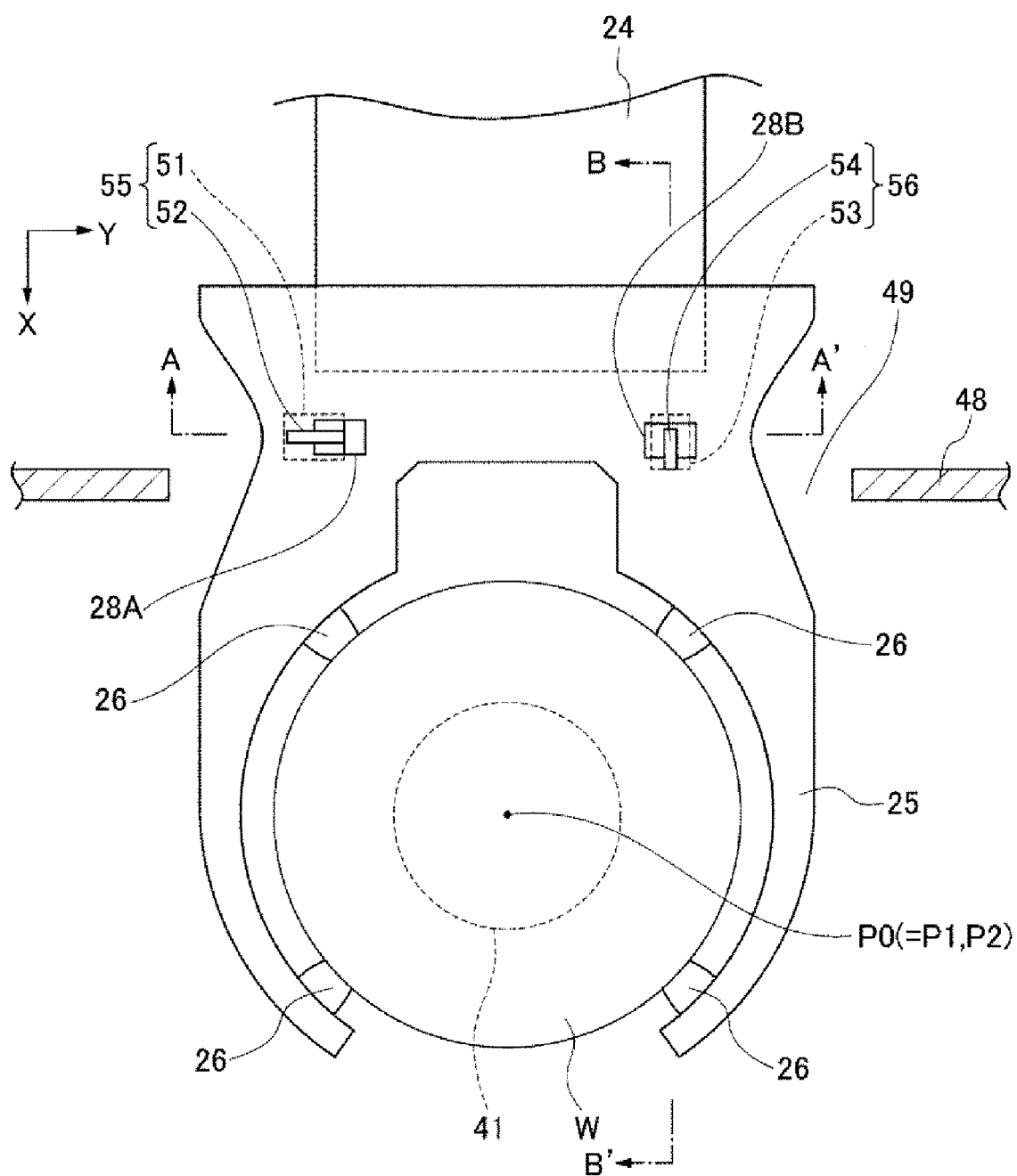
FIG. 5 is a plan view of sensors provided in a transfer path through which the transfer mechanism is moved.

The resist film forming module 4 has a vertical wall 48 which partitions the resist film forming module from the transfer section 11. Accordingly, the aforementioned processing performed in the resist film forming module 4 is suppressed from being affected by an air flow in the transfer section 11. Transfer openings 49 for the wafer W are formed at the wall 48 to be respectively located above the spin chucks 41. A light projecting part 51, a light receiving part 52, a light projecting part 53 and a light receiving part 54 are provided at periphery portions of the transfer openings 49 on the side of the transfer section 11. These light projecting parts 51 and 53 and the light receiving parts 52 and 54 will be explained with reference to a plan view of FIG. 5. FIG. 5 also illustrates the fork 25 advanced into the resist film forming module 4 through the transfer opening 49 to deliver the wafer W onto the spin chuck 41.

The light projecting part 51 and the light projecting part 53 are provided under the transfer opening 49, and the light receiving part 52 and the light receiving part 54 are provided above the transfer opening 49. The light projecting part 51 and the light receiving part 52 make a set, and the light projecting part 53 and the light receiving part 54 make a set. The light projecting part and the light receiving part in each set are arranged in the vertical direction and configured as a single transmission type photoelectric sensor, like the aforementioned set of the light projecting part 31 and the light receiving part 32. The light projecting part 51 and the light receiving part 52 are configured as a fork detecting sensor 55, and the light projecting part 53 and the light receiving part 54 are configured as a fork detecting sensor 56. These fork detecting sensors 55 and 56 constitute a second detecting unit. The light projecting parts 51 and 53 have the same configuration as the light projecting part 31 and are configured to irradiate light upwards. The light receiving part 52 has the same configuration as the light receiving part 32 except that light receiving elements are arranged in the Y direction. The light receiving part 54 has the same configuration as the light receiving part 32 except that light receiving elements are arranged in the X direction.

Figure 6:
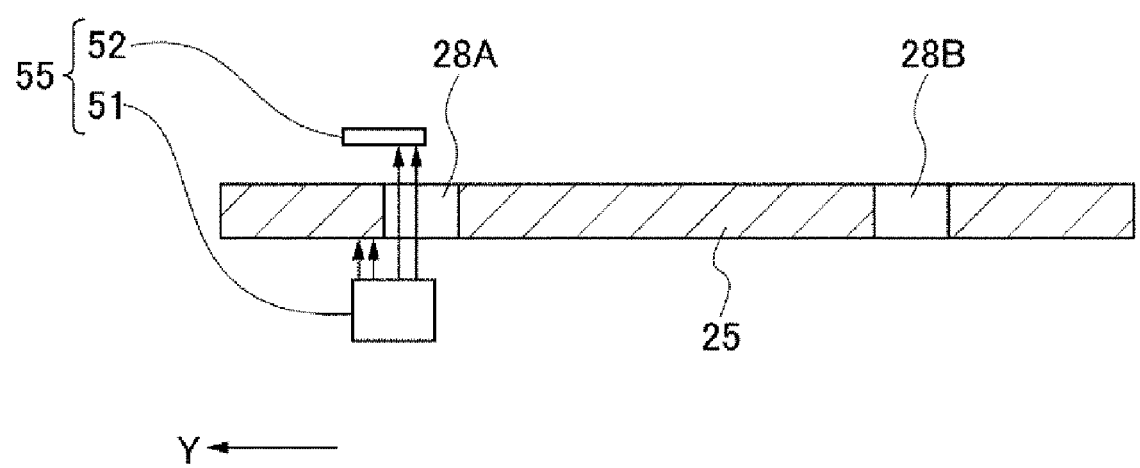
FIG. 6 is a side view illustrating the holding unit and the sensor.

FIG. 6 illustrates a cross section of the fork 25 taken along an arrow A-A' of FIG. 5, and optical paths formed by the light projecting part 51 are schematically illustrated by arrows in the drawing. As depicted in FIG. 6, the light projecting part 51 is disposed to irradiate light to the through hole 28A of the fork 25, which is located above the spin chuck 41 to deliver the wafer W, and to a front-side (Y-direction side) edge portion of the through hole 28A. A size of a light reception region in which the light is received by the light receiving part 52 may vary depending on the position of the front-side edge portion of the through hole 28A, and the light receiving part 52 outputs a signal corresponding to the size of this light reception region to the control unit 10. The control unit 10 is capable of detecting the position of the front-side edge portion of the through hole 28A (hereinafter, simply referred to as "edge portion of the through hole 28A") in the Y direction based on this output signal.

Figure 7:
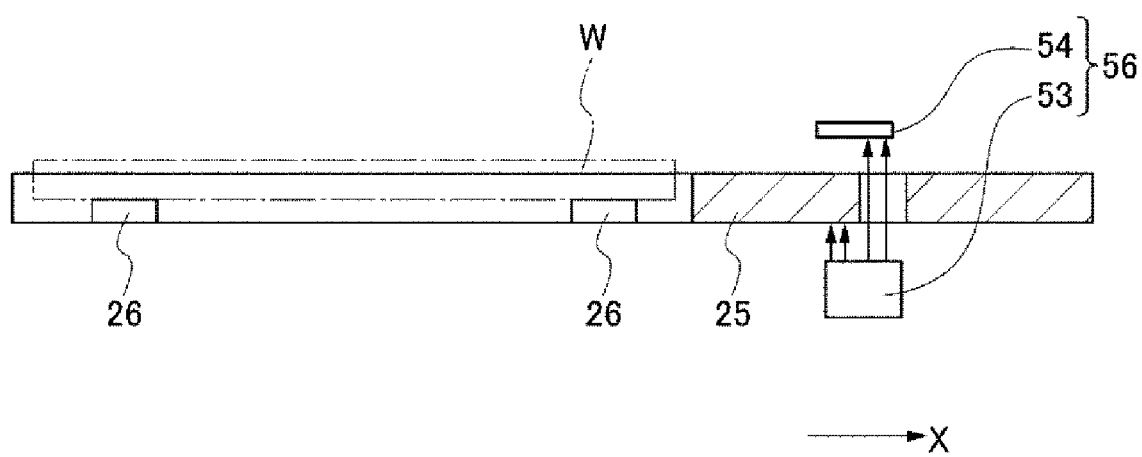
FIG. 7 is a side view illustrating the holding unit and the sensor.

FIG. 7 illustrates a cross section of the fork 25 taken along an arrow B-B' of FIG. 5, and optical paths formed by the light projecting part 53 are schematically illustrated by arrows in the drawing. As depicted in FIG. 7, the light projecting part 53 is disposed to irradiate light to the through hole 28B of the fork 25, which is located above the spin chuck 41 to deliver the wafer W, and to a right-side (moving direction side of the fork 25) edge portion of the through hole 28B. A size of a light reception region in which the light is received by the light receiving part 54 may vary depending on the position of the right-side edge portion of the through hole 28B, and the light receiving part 54 outputs a signal corresponding to the size of this light reception region to the control unit 10. The control unit 10 is capable of detecting the position of the right-side edge portion of the through hole 28B (hereinafter, simply referred to as "edge portion of the through hole 28B") in the X direction based on this output signal. The fork detecting sensors 55 and 56 are configured to detect the position of the fork 25 on two horizontal axes which are orthogonal to each other.

As illustrated in FIG. 2, the coating and developing apparatus 1 is equipped with the control unit 10 which is implemented by a computer. The control unit 10 which constitutes a position determining unit has a program storage unit. The program storage unit stores therein programs in which commands are prepared to perform the transfer of the wafer W as will be described later and to perform processings on the wafer W. According to the programs, control signals are sent to the individual constituent components of the coating and developing apparatus 1, and the transfer and the processing of the wafer W are performed. The programs are stored in a recording medium such as, but not limited to, a compact disk, a hard disk, an MO (magneto-optical) disk, or a memory card.

Now, the transfer of the wafer W onto the spin chuck 41 of the resist film forming module 4 will be explained. A position of the fork 25 for transferring the wafer W onto the spin chuck 41 is previously set, and this set position is referred to as an initial transfer position. A direction of the fork 25 and an advance position of the fork 25 on the base 24 are previously set as the initial transfer position. Pulse numbers (encoder values) respectively outputted from the encoders provided in the motors respectively belonging to the base 24 configured to advance and retreat the fork 25 and the elevation unit 23 configured to rotate the base 24 and the fork 25 are previously set. The previously set position of the fork 25 on the base 24 and the previously set direction of the fork 25 are referred to as a set advance position and a set direction, respectively.

When the wafer W is held at a preset reference holding position on the fork 25 and the fork 25 is located at the initial transfer position, the center of the wafer W on the spin chuck 41 is located on a rotation axis of the spin chuck 41. FIG. 5 illustrates a state in which the fork 25 is located at the initial transfer position and the wafer W is held at the reference holding position. In the drawing, a center point of the wafer W held at the reference holding position is referred to as P0; a center point of the actually held wafer W, P1; the rotation axis of the spin chuck 41, P2. Further, the aforementioned term "direction of the fork 25" refers to a direction of the center point P0 viewed from the rotation center of the fork 25.

In case that the wafer W is held on the fork 25 with a deviation from the reference holding position, the fork 25 is moved with deviations from the set advance position and the set direction in order to compensate for this deviation of the wafer W when transferring the wafer W onto the spin chuck 41. The fork 25 is moved such that the encoder values deviated from the previously set encoder values by an amount corresponding to the deviation of the wafer W are outputted. This moved position of the fork 25 is referred to as a temporary position of transfer (temporary transfer position). Further, the positions of the edge portions (edge positions) of the through holes 28A and 28B are detected by the fork detecting sensors 55 and 56, respectively. Then, there is a detected deviation between these detected edge positions and target edge positions supposed to be obtained when the fork 25 is moved from the initial transfer position to the temporary transfer position. A position deviation between the set temporary transfer position and the actual position of the fork 25 is detected.

Then, to offset this position deviation, the direction of the fork 25 is made to be further deviated from the set direction, and the position of the fork 25 on the base 24 is made to be further deviated from the set advance position. The fork 25 is moved such that the encoder value outputted from each encoder is further deviated from the previously set encoder value by an amount corresponding to the position deviation of the fork 25, so that the transfer of the wafer W is performed in the state that the center point P1 of the wafer W is located on the rotation axis P2.

There may be various causes for this position deviation of the fork 25. For example, the frame of the resist film forming module 4 may be expanded or contracted due to a change in the temperature of the heat plate of the heating module 12, which is caused as a recipe for processing the wafer W is changed; the timing belt of the driving mechanism configured to drive the individual components of the transfer mechanism F3 might be expanded or contracted due to this change in the temperature of the heat plate; a horizontal movement of the base 24 of the transfer mechanism F3 might be affected by inertia as the base 24 is rotated while the base 24 is being moved horizontally; and so forth. By correcting the position deviation as stated above, occurrences of an abnormal transfer of the wafer W due to these various causes can be suppressed.

Figure 8:
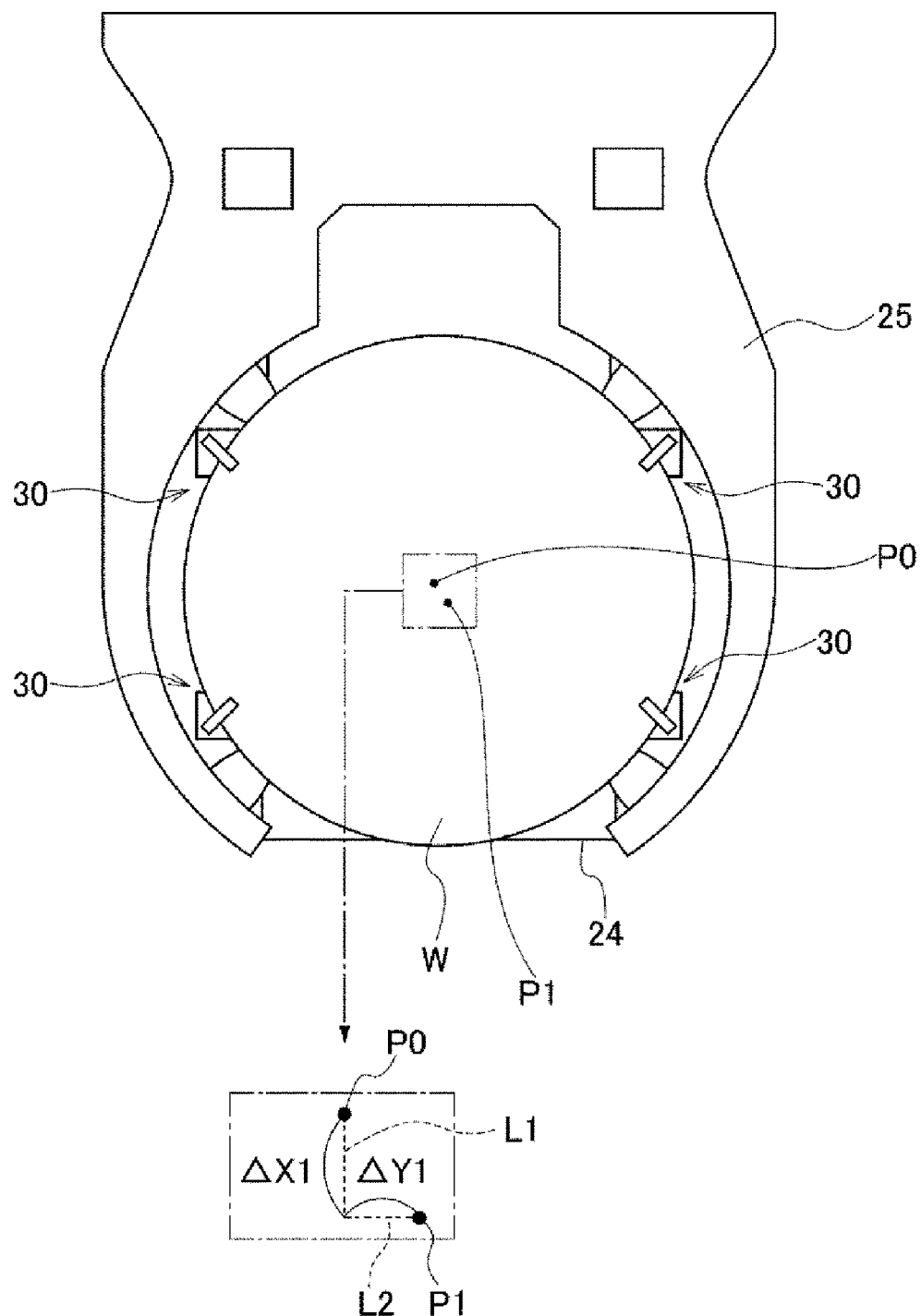
FIG. 8 is a plan view illustrating a state in which a wafer is being transferred by the holding unit.
Figure 9:
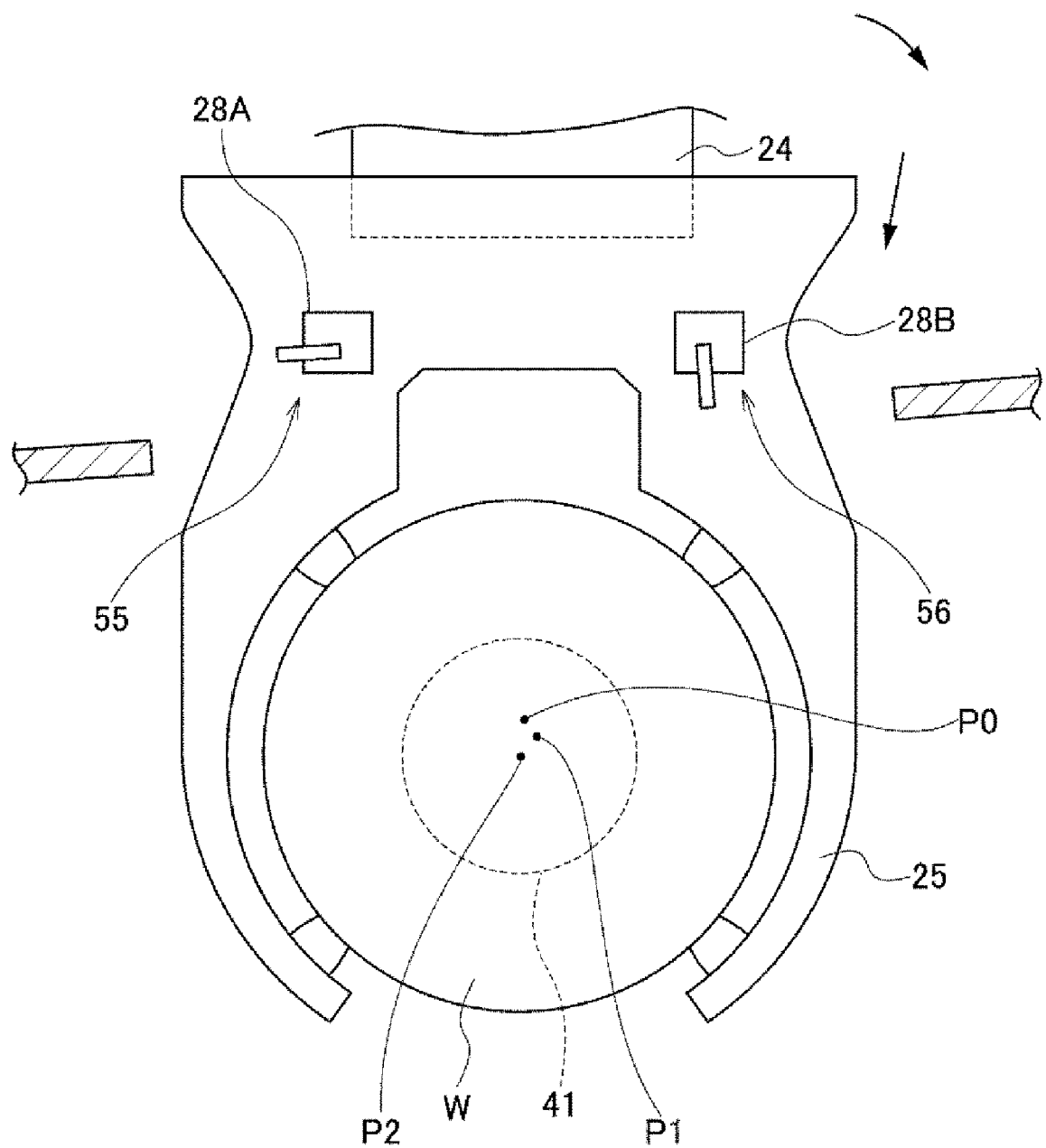
FIG. 9 is a plan view illustrating a state in which the wafer is being transferred by the holding unit.
Figure 10:
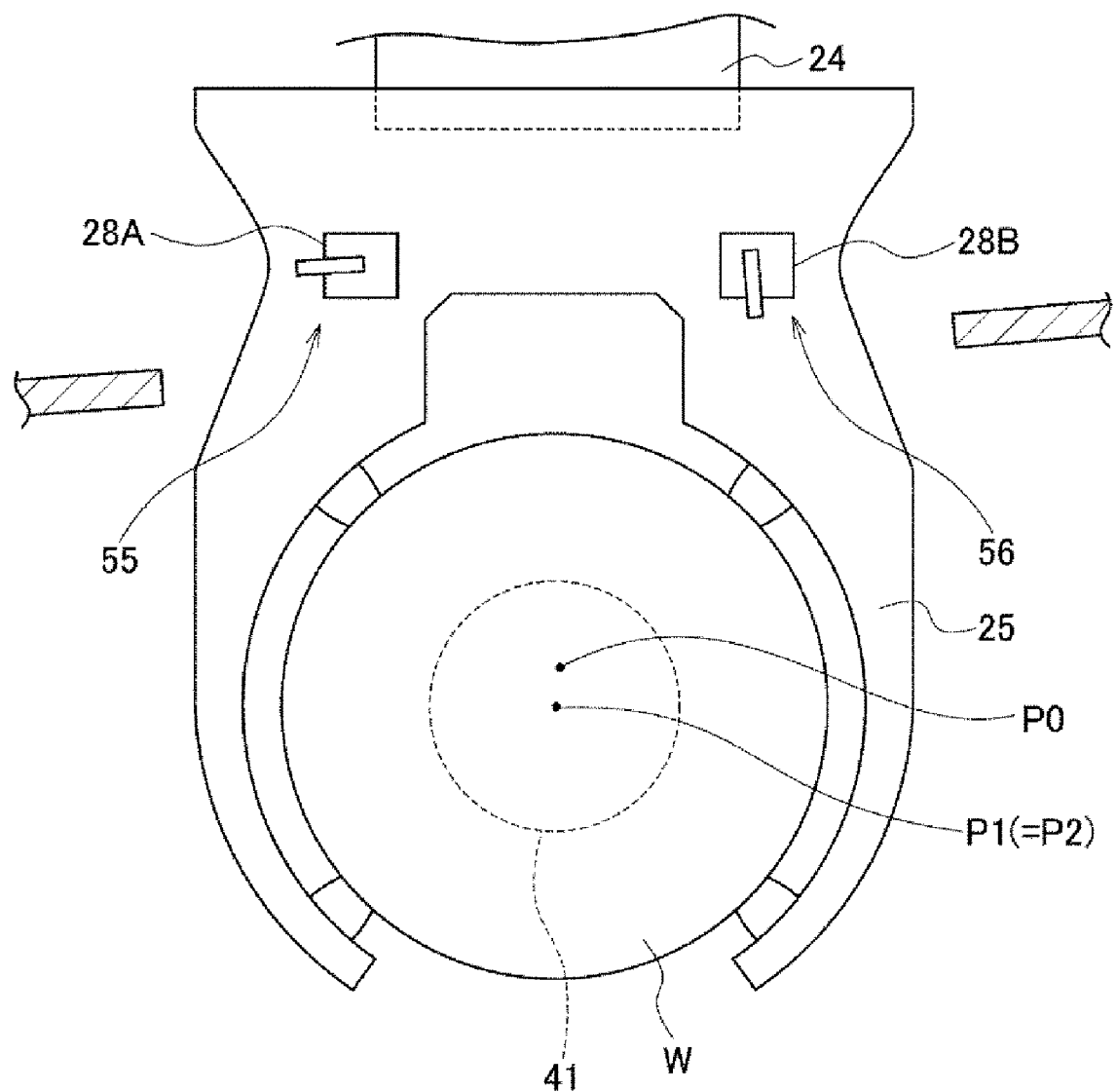
FIG. 10 is a plan view illustrating a state in which the wafer is being transferred by the holding unit.

Now, referring to FIG. 8 to FIG. 10 which provide detailed illustration of the operation of the fork 25, the transfer of the wafer W into the resist film forming module 4 will be elaborated. In FIG. 8, for the convenience of explanation, a region including the center point (P0, P1) of the wafer W is shown enlarged at the end of an arrow of a dashed dotted line. Further, the edge position of the through hole 28A and the edge position of the through hole 28B detected when the fork 25 is located at the initial transfer position will be referred to as reference positions of the edge portions (reference edge positions).

First, in the state that the base 24 is located in front of the transit module TRS3 and the fork 25 is located at the advance position, the base 24 is raised, and the wafer W is delivered onto the fork 25 from the transit module TRS3 and held by the fork 25. Then, the fork 25 is moved to the retreat position, and the position of the center point P1 of the wafer W is calculated based on the detection signals from the respective wafer detecting sensors 30, and a deviation amount between this center point P1 and the center point P0 of the wafer W located at the reference holding position is detected. As for this deviation amount, a deviation amount $\Delta X1$ in the horizontal direction along a first straight line L1 connecting the rotation center of the fork 25 and the center point P1, and a deviation amount $\Delta Y1$ in the horizontal direction along a second straight line L2 orthogonal to the first straight line are respectively calculated (FIG. 8). The position of the wafer W on the fork 25 is now detected.

Subsequently, the frame 22 is moved to the set position by the front-rear driving unit 21 of the transfer mechanism F3. The frame 22 is moved such that the set encoder value is outputted from the motor of the front-rear driving unit 21. Along with this movement of the frame 22, the fork 25 is set to the set direction. Thereafter, to transfer the wafer W onto the spin chuck 41, the forward movement of the fork 25 and the rotation of the fork 25 are performed at the same time, for example. At this time, the fork 25 is moved forward such that the fork 25 is located at a position deviated from the set advance position by an amount corresponding to the deviation amount $\Delta X1$, and the fork 25 is rotated such that the fork 25 is oriented toward a direction deviated from the set direction by an amount corresponding to the deviation amount $\Delta Y1$. The fork 25 is moved to and stopped at the aforementioned temporary transfer position so that the deviation amounts $\Delta X1$ and $\Delta Y1$ are compensated for, thus allowing the center point P1 of the wafer W to be aligned with the rotation axis P2 of the spin chuck 41 (FIG. 9).

Thereafter, the edge position of the through hole 28A of the fork 25 is detected by the fork detecting sensor 55, and the edge position of the through hole 28B is detected by the fork detecting sensor 56. Meanwhile, the reference edge position of the through hole 28A is corrected as much as the direction of the fork 25 is changed from the set direction by an amount corresponding to the deviation amount $\Delta Y1$, and this corrected reference edge position is acquired as a target edge position of the through hole 28A. Likewise, the reference edge position of the through hole 28B is corrected by an amount corresponding to the deviation amount $\Delta X1$, and this corrected reference edge position is acquired as a target edge position of the through hole 28B. Then, a deviation amount $\Delta Y2$ between the target edge position and the detected edge position of the through hole 28A is calculated, and a deviation amount $\Delta X2$ between the target edge position and the detected edge position of the through hole 28B is calculated.

Afterwards, the forward or backward movement of the fork 25 by an amount corresponding to the deviation amount $\Delta X2$ and the rotation of the fork 25 by an amount corresponding to the deviation amount $\Delta Y2$ are performed at the same time, for example, so that the fork 25 is moved to locate the center point P1 of the wafer W on the rotation axis P2 of the spin chuck 41. The fork 25 is moved from the aforementioned temporary transfer position to a transfer position of the wafer W which is newly set based on the temporary transfer position and the deviation amounts $\Delta X2$ and $\Delta Y2$ (FIG. 10). Thereafter, the elevating pins 43 of the resist film forming module 4 are raised, and the wafer W is carried onto the elevating pins 43 from the fork 25. Then, the fork 25 is retreated and the elevating pins 43 are lowered, so that the wafer W is transferred onto the spin chuck 41.

Furthermore, though omitted in the above description, after the fork 25 holds the wafer W thereon and the frame 22 is moved to the previously set position and before the fork 25 holding thereon the wafer W is moved forward and rotated at the same time to be placed at the temporary transfer position, by the cooperation of the forward/backward movement of the fork 25 which does not hold the wafer W and the upward/downward movement of the elevating pins 43, the wafer W held by the spin chuck 41 is transferred onto the corresponding fork 25. Further, the data required to correct the position of the fork 25, including the initial transfer position, the reference holding position, the reference edge positions of the through holes 28A and 28B, the forward/backward movements amounts of the fork 25 respectively corresponding to the deviation amounts $\Delta X1$ and $\Delta X2$, the rotation amounts of the fork 25 respectively corresponding to the deviation amounts $\Delta Y1$ and $\Delta Y2$, and so forth, are previously stored in the control unit 10. Based on the data, the control over the above-described operation of the fork 25 is performed.

According to the transfer mechanism F3 provided in the coating and developing apparatus 1, the position of the wafer W held by the fork 25 is detected by the wafer detecting unit 3. Based on this detection result, the fork 25 is moved to be located at the temporary transfer position deviated from the previously set initial transfer position in order to transfer the wafer W onto the spin chuck 41 of the resist film forming module 4. This fork 25 is controlled to be further moved from the temporary transfer position based on the edge positions of the through holes 28A and 28B detected by the fork detecting sensors 55 and 56, so that the transfer of the wafer W is performed. Accordingly, the wafer W can be transferred such that the center point P1 of the wafer W aligns with the rotation axis P2 of the spin chuck 41 with high accuracy. As a result, a width of the resist film removed by the thinner in the resist film forming module 4 can be suppressed from being deviated from the set value, so that the yield of the wafer W can be improved.

In the above-described example, the position deviations of the fork 25 in the two mutually orthogonal directions on the horizontal plane are respectively detected by using the fork detecting sensors 55 and 56, and the fork 25 is moved to compensate for the position deviations in the respective directions. Even in case of, however, detecting the position deviation of the fork 25 in only one of the two directions by using one of the two fork detecting sensors 55 and 56 and moving the fork 25 to offset the position deviation in the one direction, the deviation between the center point P1 of the wafer W and the rotation axis P2 can be suppressed, so that this configuration is also included in the scope of the present disclosure. Further, the fork detecting sensors 55 and 56 may not be limited to being provided in the resist film forming module 4 but may be provided at positions within the transfer section 11 away from the resist film forming module 4. The fork detecting sensors 55 and 56 may not be limited to being provided in the resist film forming module 4 as long as they are capable of detecting the position of the fork 25 in a moving path through which the wafer W is transferred into the resist film forming module 4. However, it may be still desirable that the fork detecting sensors 55 and 56 are provided at the resist film forming module 4 as stated above to avoid a contact (interference) between the fork detecting sensors 55 and 56 and the transfer mechanism F3.

In the above-described example, though the fork detecting sensors 55 and 56 are provided at the opening periphery portion of the transfer opening 49, the fork detecting sensors 55 and 56 may be provided at positions away from the opening periphery portion of the transfer opening 49 or may be provided within the transfer opening 49. Further, the configuration of providing the second detecting unit at a carry-in opening of the substrate opened at the module may not only be limited to providing the sensors 55 and 56 within the transfer opening 49 (carry-in opening) but also includes providing the sensors 55 and 56 at the opening periphery portion of the transfer opening 49 or in the vicinity thereof, as stated above. The configuration of providing the second detecting unit at the carry-in opening of the substrate includes providing the fork detecting sensors 55 and 56 in the vicinity of the transfer opening 49 such that the fork 25 located within the transfer opening 49 can be detected.

In the above-described exemplary embodiment, though the photoelectric sensor composed of the light projecting part and the light receiving part is used as the second detecting unit configured to detect the fork 25, a CCD (Charge Coupled Device) camera may be used instead of the photoelectric sensor, and the position of the fork 25 may be detected by detecting the through holes 28A and 28B of the fork 25 with this CCD camera. In the case of using this CCD camera, a mark such as a dot or an asterisk may be given at the fork 25 instead of the through holes 28A and 28B, and the position of the fork 25 may be detected based on the imaged position of the corresponding mark. The mark is a sign for detecting the position of the fork 25. Accordingly, the exemplary embodiment is not limited to forming the through holes 28A and 28B at the fork 25. Like the fork detecting sensors 55 and 56, the CCD camera is not limited to being provided at the resist film forming module 4 but may be provided at a position within the transfer section 11 away from the resist film forming module 4 to image the fork 25 which is moved in the transfer section 11. Furthermore, the position of the wafer W on the fork 25 may be detected by providing this CCD camera at the base 24 instead of the wafer detecting sensor 30 and imaging the wafer W held by the fork 25.

As for the fork detecting sensors 55 and 56, one of the light projecting part and the light receiving part may be provided at the fork 25, and the other of the light projecting part and the light receiving part may be provided at the resist film forming module 4. In this configuration, light may be irradiated from the light projecting part to the light receiving part when the fork 25 is moved to the temporary transfer position, and the position deviation of the fork 25 may be detected based on a light reception amount in the light receiving part. Further, the aforementioned CCD camera may be disposed at, for example, a bottom surface of the fork 25, and the aforementioned mark may be assigned at a preset position of the resist film forming module 4. When the fork 25 is moved to the temporary transfer position, imaging of the mark is performed, and the position deviation of the fork 25 may be detected based on the position of the mark on the acquired image. As stated above, the second detecting unit may be provided at the fork 25. Further, the mark may be provided at the transfer section 11, not at the module.

Further, the fork 25 is configured to transfer the wafer W by being rotated around the vertical axis. The transfer of the wafer W may be performed by, after rotating the fork 25 to change a direction thereof such that the fork 25 is located at a temporary position based on the position of the wafer W on the fork 25, moving the direction of the fork 25 based on a deviation between the temporary position and the position of the fork 25 when the direction thereof is changed. The movement of the fork in the transversal direction includes the rotation of the fork.

Further, the wafer detecting sensor 30 may not be limited to being provided at the base 24. By way of example, the wafer detecting sensor 30 may be fixed at a preset position within the transfer section 11, and the position of the wafer W on the fork 25 may be detected as the fork 25 holding the wafer W is moved to the preset position within the transfer section 11 before being transferred into the resist film forming module 4. Furthermore, in the above-described transfer example, though the deviation of the center point P1 of the wafer W with respect the rotation axis P2 of the spin chuck 41 in the Y direction is corrected by rotating the fork 25, this correction of the deviation may be performed by moving the position of the fork 25 in the Y direction through moving the frame 22 of the transfer mechanism F3 in the Y direction.

Though the exemplary embodiment in which the wafer W is transferred into the resist film forming module 4 has been described so far, the module as a transfer destination is not limited to the resist film forming module 4. By way of example, the wafer W may be transferred into the heating module 12. In such a case, the detection of the fork 25 may be performed by providing the fork detecting sensors 55 and 56 at positions corresponding to the heating module 12. Further, though it is desirable that the above-stated transfer control is performed for a module configured to process the wafer W by supplying a processing liquid onto the peripheral portion of the wafer W being rotated, the processing liquid is not limited to the thinner. For example, the processing liquid may be a resist for forming a film locally at the peripheral portion of the wafer W or a cleaning liquid for cleaning the peripheral portion of the wafer W locally.

Another transfer method different from the transfer method described in FIG. 8 to FIG. 10 will be discussed. First, the fork 25 receives the wafer W from the transit module TRS3, and, if the deviation amounts $\Delta X1$ and $\Delta Y1$ of the center points P0 and P1 of the wafer W described in FIG. 8 is detected, the fork 25 is moved to be located at the initial transfer position regardless of the deviation amounts $\Delta X1$ and $\Delta Y1$. This moved position is set as the temporary transfer position. Thereafter, the edge position of the through hole 28A and the edge position of the through hole 28B are respectively detected by the fork detecting sensors 55 and 56, and a difference $\Delta Y3$ between the reference edge position of the through hole 28A and the actually detected edge position thereof and a difference $\Delta X3$ between the reference edge position of the through hole 28B and the actually detected edge position thereof are respectively acquired.

Then, the position of the fork 25 may be corrected by moving the fork 25 on the base 24 forward or backward to compensate for the sum of $\Delta X1$ and $\Delta X3$ while rotating the fork 25 to compensate for the sum of $\Delta Y1$ and $\Delta Y3$, so that the center point P1 of the wafer W is aligned with the rotation axis P2 of the spin chuck 41. Here, however, if the position of the fork 25 is not deviated when performing the transfer of the wafer W as stated in FIG. 8 to FIG. 10, the temporary transfer position becomes the transfer position. Since the wafer W can be transferred into the resist film forming module 4 at the temporary transfer position without the need to adjust the fork 25 based on the temporary transfer position, a reduction of a throughput can be prevented, which is desirable. Moreover, in the method described in FIG. 8 to FIG. 10, since the position deviation of the fork 25 is detected in the state that the fork 25 is located close to a position at which the wafer W is actually transferred, the position of the fork 25 can be corrected more accurately such that the center point P1 of the wafer W is aligned with the rotation axis P2 of the spin chuck 41.

Figure 11:
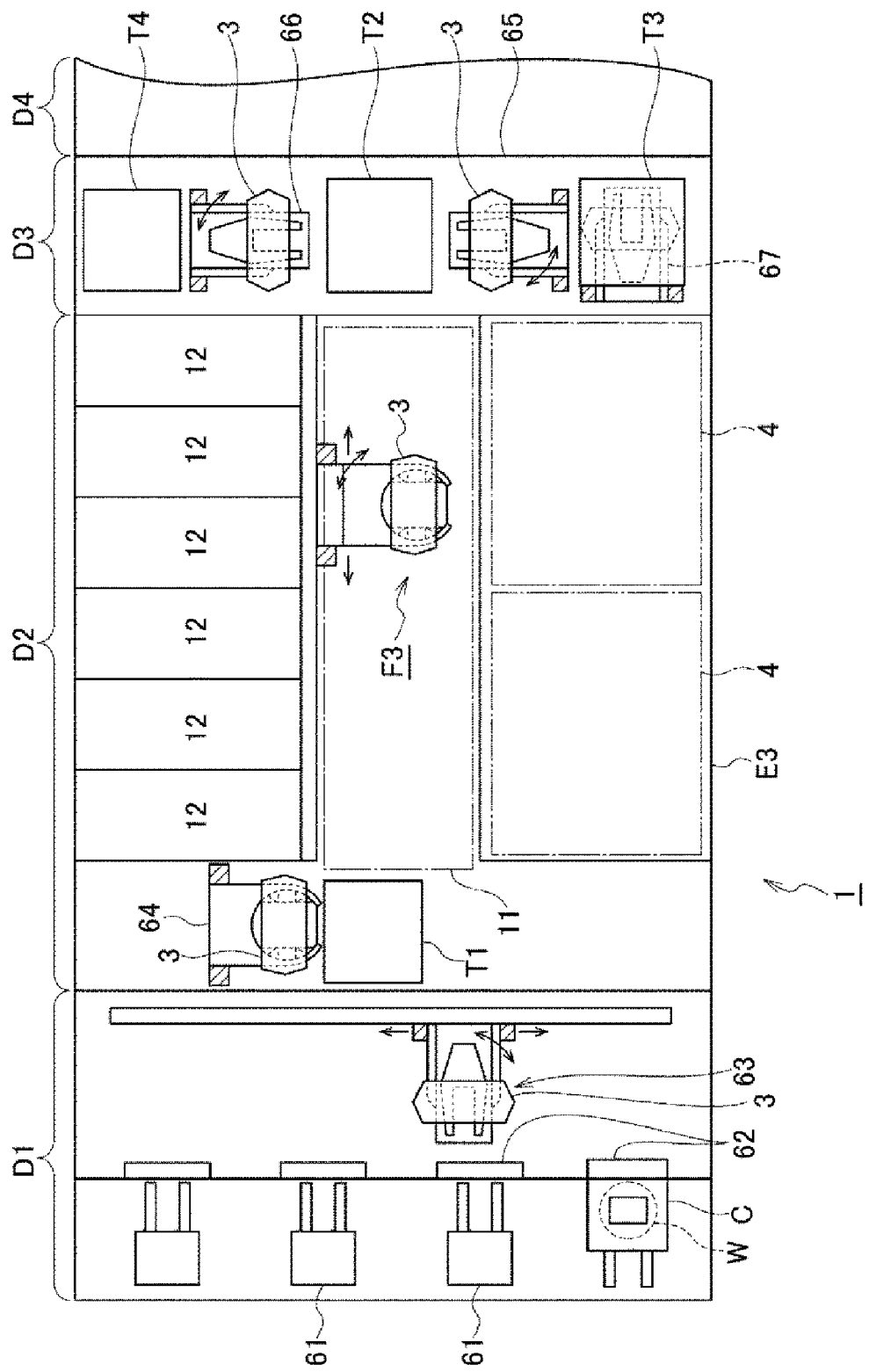
FIG. 11 is a plan view of the coating and developing apparatus.
Figure 12:
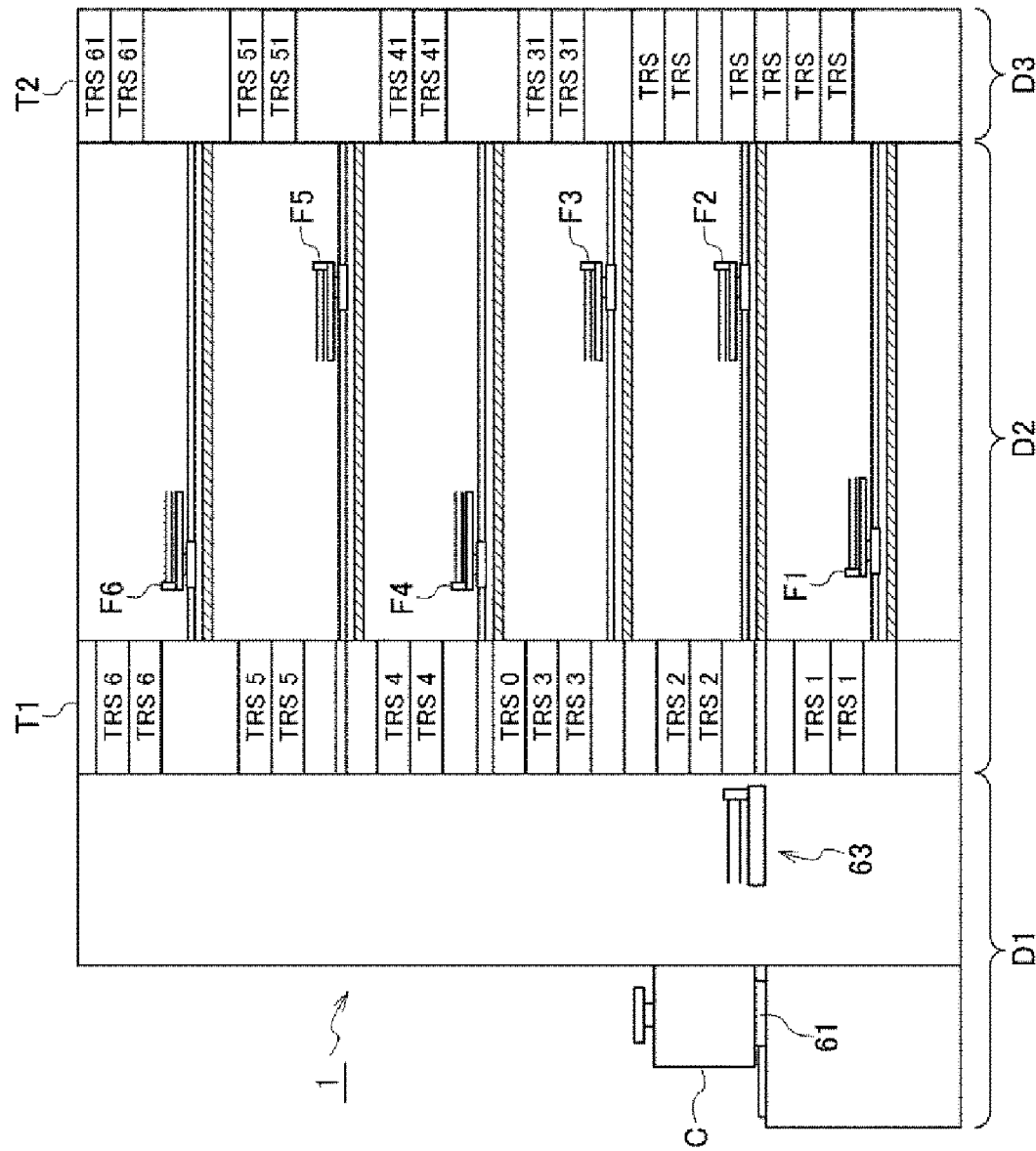
FIG. 12 is a side view of the coating and developing apparatus.

Now, an overall configuration of the coating and developing apparatus 1 will be explained with reference to a plan view of FIG. 11 and a longitudinal side view of FIG. 12. In the coating and developing apparatus 1, the carrier block D1, the processing block D2 and the interface block D3 are connected in a straight light shape in the front-rear direction. The exposure apparatus D4 is connected to the interface block D3. The carrier block D1 is configured to carry carriers C into/out of the coating and developing apparatus 1 and is equipped with the mounting tables 61 for the carriers C; opening/closing units 62; and a transfer mechanism 63 configured to transfer wafers W from the carrier C through the opening/closing unit 62.

The processing block D2 includes unit blocks E1 to E6 which are stacked on top of each other in sequence from the bottom and configured to perform liquid processings on the wafers W. Transfer and processing of the wafers W are performed in these unit blocks E1 to E6 in parallel. The unit blocks E1 and E2 have the same configuration; the unit blocks E3 and E4 have the same configuration; and the unit blocks E5 and E6 have the same configuration.

The unit blocks E1, E2, E5 and E6 have the same configuration as the unit blocks E3 and E4 except that chemical liquids supplied to the wafer W are different. Each of the unit blocks E1 and E2 is equipped with, instead of the resist film forming module 4, an antireflection film forming module configured to supply a chemical liquid for forming an antireflection film onto the wafer W. Each of the unit blocks E5 and E6 is equipped with, instead of the resist film forming module 4, a developing module configured to develop a resist film by supplying a developing liquid as a chemical liquid onto the wafer W. In FIG. 12, transfer mechanisms of the unit blocks E1 to E6 are assigned reference numerals F1 to F6, respectively.

Within the processing block D2, a tower T1 vertically extended along the unit blocks E1 to E6 and a transfer mechanism 64 configured to be moved up and down and configured to transfer the wafer W with respect to the tower T1 are provided at the side of the carrier block D1. The tower T1 is composed of a multiple number of modules stacked on top of each other and includes transit modules TRS in which the wafers W are placed.

The interface block D3 includes towers T2, T3 and T4 vertically extended along the unit blocks E1 to E6, and is equipped with a transfer mechanism 65 configured to be moved up and down and configured to transfer the wafers W with respect to the tower T2 and the tower T3; a transfer mechanism 66 configured to be moved up and down and configured to transfer the wafer W with respect to the tower T2 and the tower T4; and a transfer mechanism 67 configured to transfer the wafer W between the tower T3 and the exposure apparatus D4.

The tower T2 includes transit modules TRS, buffer modules configured to accommodate and stand-by multiple wafers W before being subjected to an exposure process, buffer modules configured to store therein the multiple wafers W after being subjected to the exposure process, temperature adjustment modules SCPL configured to perform temperature adjustment on the wafer W, and so forth which are stacked on top of each other. Here, the illustration of the buffer modules and the temperature adjustment modules is omitted. The transit modules TRS3 and TRS31 shown in FIG. 1 are respectively provided in the towers T1 and T2. Further, though modules are respectively provided in the towers T3 and T4 as well, elaboration thereof will be omitted herein.

A transfer path of the wafer W in a system composed of the coating and developing apparatus 1 and the exposure apparatus D4 will be explained. The wafer W is transferred from the carrier C into a transit module TRS0 of the tower T1 in the processing block D2 by the transfer mechanism 63. Then, the wafer W is transferred into either the unit block E1 or the unit block E2 from the transit module TRS0. For example, in the case of transferring the wafer W into the unit block E1, the wafer W is transferred from the transit module TRS0 to a transit module TRS1 (a transit module into which the wafers W can be transferred by the transfer mechanism F1) corresponding to the unit block E1 among the transit modules TRS of the tower T1. In case of transferring the wafer W into the unit block E2, the wafer W is transferred from the transit module TRS0 to a transit module TRS2 corresponding to the unit block E2 among the transit modules TRS of the tower T1. These transfers of the wafer W are performed by the transfer mechanism 64.

The wafer W is transferred in the order of the transit module TRS1 (TRS2)→the antireflection film forming module→the heating module 12→the transit module TRS1 (TRS2), and is subsequently transferred into either the transit module TRS3 corresponding to the unit block E3 or a transit module TRS4 corresponding to the unit block E4 by the transfer mechanism 64.

Then, the wafer W transferred into the transit module TRS3 (TRS4) is transferred into the unit block E3 (E4) from the transit module TRS3 (TRS4) and processed therein as described above and then is transferred into the transmit module TRS31 (TRS41) of the tower T2. Thereafter, the wafer W is carried into the exposure apparatus D4 through the tower T3 by the transfer mechanisms 65 and 67, so that the resist film is exposed.

The wafer W after being exposed is transferred between the towers T2 and T4 by the transfer mechanisms 66 and 67, and carried into a transit module TRS51 (TRS61) of the tower T2 corresponding to the unit block E5 (E6). Then, the wafer W is transferred into the heating module 12 to be heated. A so-called post exposure bake (PEB) is performed. Subsequently, the wafer W is transferred into the developing module and the developing liquid is supplied onto the wafer W, so that a resist pattern is formed. Thereafter, the wafer W is transferred into the transit module TRS5 (TRS6) of the tower T1 and returned back into the carrier C by the transfer mechanism 63.

The above-described exemplary embodiments are not limited to being applied to the transfer mechanism F3 of the unit block E3 but are applicable to another transfer mechanism provided in the coating and developing apparatus 1. Further, the exemplary embodiments are not limited to being applied to the substrate transfer device (substrate transfer mechanism) provided within the coating and developing apparatus but is also applicable to a transfer device for the wafer W provided in a substrate processing apparatus equipped with a cleaning module configured to clean the wafer W, a coating module configured to coat a chemical liquid to form an insulating film on the wafer W, a processing module configured to coat an adhesive for bonding the wafer W, and so forth. The substrate as a transfer target may not be limited to the wafer W but may be, by way of example, a glass substrate for use in manufacturing a flat panel display. The above-described exemplary embodiments are not limiting and can be appropriately modified or combined in various ways.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate transfer device for moving a substrate from one module to another module, comprising:
 a substrate holding unit configured to hold a substrate with a fork in the one module;
 a first detecting unit configured to detect a holding deviation between a reference holding position and a position of the substrate on the fork of the substrate holding unit;
 a transfer mechanism configured to transfer the substrate holding unit toward a temporary position in the other module, the temporary position being set to compensate for the holding deviation; and
 a second detecting unit configured to detect a transferred position of the substrate holding unit in the other module,
 a controller configured to calculate a compensation value based on a difference between the transferred position of the substrate holding unit and the temporary position of the substrate holding unit at the other module, and to adjust a position of the fork of the substrate holding unit based on the compensation value at the other module.

2. The substrate transfer device of claim 1,
 wherein the temporary position is set based on the position of the substrate on the substrate holding unit by the controller, and
 the controller is configured to determine, based on the transfer deviation, a position deviated from the temporary position as the transfer position.

3. The substrate transfer device of claim 1,
 wherein the second detecting unit is configured to detect the position of the substrate holding unit on two horizontal axes which are orthogonal to each other.

4. The substrate transfer device of claim 1,
 wherein the second detecting unit is provided in the other module to detect the position of the substrate holding unit.

5. The substrate transfer device of claim 4,
 wherein the second detecting unit is provided at a carry-in opening of the substrate which is opened at the other module.

6. The substrate transfer device of claim 1,
 wherein the second detecting unit is provided at the substrate holding unit.

7. The substrate transfer device of claim 1,
 wherein the first detecting unit is composed of multiple sensors configured to detect a position of an edge portion of the substrate, which is held by the substrate holding unit, at different positions.

8. The substrate transfer device of claim 1,
 wherein the other module comprises:
 a mounting unit configured to hold a central portion of a rear surface of the substrate and rotate the substrate; and
 a processing liquid supply nozzle configured to supply a processing liquid onto an edge portion of the substrate being rotated to perform a processing.

9. A substrate transfer method for moving a substrate from one module to another module, comprising:
 holding a substrate with a fork of a substrate holding unit in the one module;
 detecting, by a first detecting unit, a holding deviation between a reference holding position and a position of the substrate on the fork of a substrate holding unit;
 moving a substrate holding unit holding the substrate toward a temporary position in the other module, the temporary position being set to compensate for the holding deviation;
 detecting, by a second detecting unit, a transferred position of the substrate holding unit;
 calculating, by the controller, a compensation value based on a difference between the transferred position of the substrate holding unit and the temporary position of the substrate holding unit at the other module;
 adjusting a position of the fork of the substrate holding unit based on the compensation value at the other module.

10. A computer-readable recording medium having stored thereon computer-executable instructions that, in response to execution, cause a substrate transfer method as claimed in claim 9 to be performed in a substrate transfer device configured to hold a substrate by a substrate holding unit and transfer the substrate.

* * * * *